[19] United States Patent
Tihanyi et al.

[11] Patent Number: 5,272,399
[45] Date of Patent: Dec. 21, 1993

[54] CIRCUIT LIMITING THE LOAD CURRENT OF A POWER MOSFET

[75] Inventors: Jenoe Tihanyi; Ludwig Leipold; Rainald Sander, all of München, Fed. Rep. of Germany

[73] Assignee: Siemens Aktiengesellschaft, Munich, Fed. Rep. of Germany

[21] Appl. No.: 4,970

[22] Filed: Jan. 15, 1993

[30] Foreign Application Priority Data

Feb. 25, 1992 [DE] Fed. Rep. of Germany ....... 4205753

[51] Int. Cl.$^5$ .......................... H03K 3/01; H03K 5/08
[52] U.S. Cl. ..................... 307/572; 307/568; 307/574; 307/548; 307/546; 307/270; 323/274; 323/279; 323/284
[58] Field of Search ............... 307/270, 546, 548, 572, 307/574, 568; 323/274, 279, 284

[56] References Cited

U.S. PATENT DOCUMENTS 4,952,827 8/1990 Leipold et al. ................. 307/571
5,004,970 4/1991 Barou ........................ 323/279

Primary Examiner—Margaret R. Wambach
Attorney, Agent, or Firm—Herbert L. Lerner; Laurence A. Greenberg

[57] ABSTRACT

A circuit configuration for limiting current flowing through a power MOSFET includes a voltage divider being connected between drain and source terminals of the power MOSFET and having a node at which a voltage following a drain-to-source voltage of the power MOSFET drops. A control transistor has a load path connected between the gate terminal and the source terminal of the power MOSFET. The control transistor is made conducting as a function of the voltage at the node of the voltage divider if the drain-to-source voltage of the power MOSFET exceeds a predetermined value. A resistor is connected between the gate terminal of the control transistor and the gate terminal of the power MOSFET. A depletion FET has a drain terminal connected to the gate terminal of the control transistor. The source terminal of the depletion FET is connected to the node of the voltage divider. The gate terminal of the depletion FET is connected to the source terminal of the power MOSFET.

5 Claims, 2 Drawing Sheets

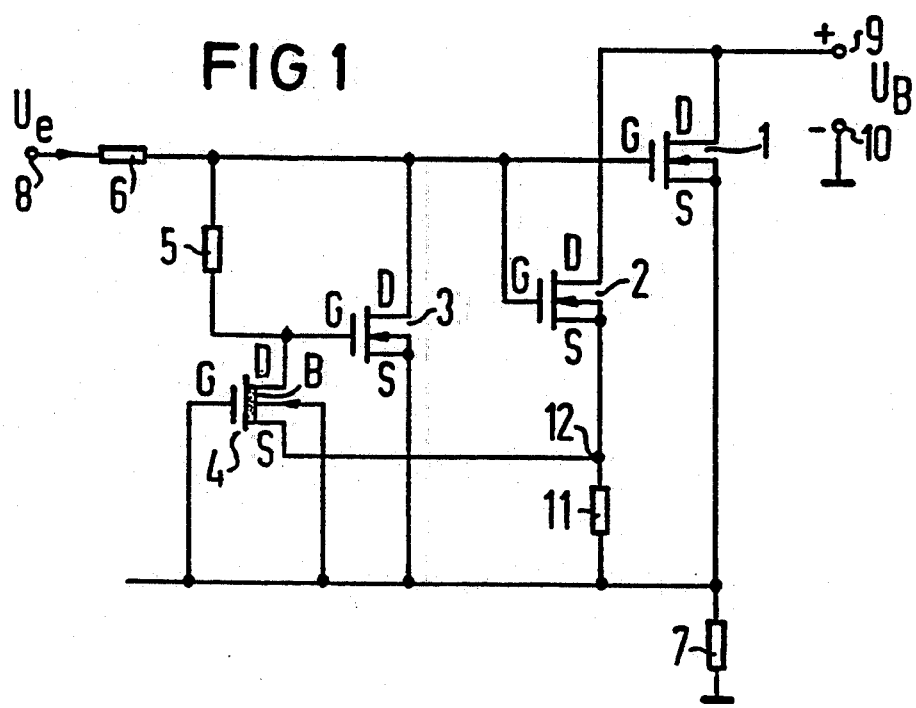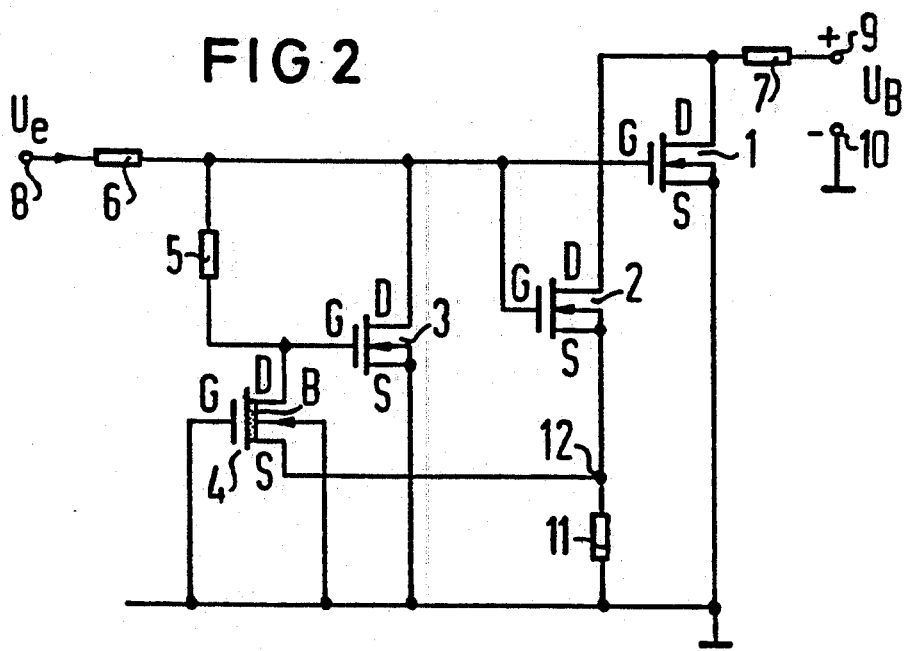

CIRCUIT LIMITING THE LOAD CURRENT OF A POWER MOSFET

The invention relates to a circuit configuration for limiting the current flowing through a power MOSFET, including a voltage divider having nodes at which a voltage that follows the drain-to-source voltage of the power MOSFET drops, and a control transistor having a load path being connected between the gate terminal and the source terminal of the power MOSFET and being made conducting as a function of the voltage at the node of the voltage divider if the drain-to-source voltage of the power MOSFET exceeds a predetermined value.

One such circuit configuration is described in Published European Application No. 0 369 048 A1, corresponding to U.S. Pat. No. 4,952,827, for example. In that device, the voltage divider is parallel to a series circuit including the power MOSFET and a load. The node of the voltage divider is connected to the control terminal of the control transistor. If the drain-to-source voltage of the power MOSFET rises, for instance from a short circuit of the load, then the gate-to-source voltage of the control transistor located between the gate terminal and the source terminal of the power MOSFET increases. If the cutoff voltage of the control transistor is exceeded, then that transistor begins to conduct, and the gate-to-source voltage of the power MOSFET is reduced. As a result, the current flowing through the power MOSFET becomes less, and an overload can be avoided. Since the source terminal of the power MOSFET and the low end of the voltage divider are at different potentials, such a circuit configuration is poorly suited to integration.

It is accordingly an object of the invention to provide a circuit configuration for limiting the load current of a power MOSFET, which overcomes the hereinaforementioned disadvantages of the heretofore-known devices of this general type and which does so in such a way that the circuit configuration is readily integratable.

With the foregoing and other objects in view there is provided, in accordance with the invention, in a circuit having a power MOSFET with gate, source and drain terminals and a drain-to-source voltage, a circuit configuration for limiting current flowing through the power MOSFET, comprising a voltage divider being connected between the drain and source terminals of the power MOSFET and having a node at which a voltage following the drain-to-source voltage of the power MOSFET drops; a control transistor with a gate or control terminal and with source and drain terminals defining a load path connected between the gate terminal and the source terminal of the power MOSFET, the control transistor being made conducting as a function of the voltage at the node of the voltage divider if the drain-to-source voltage of the power MOSFET exceeds a predetermined value; a resistor connected between the gate or control terminal of the control transistor and the gate terminal of the power MOSFET; and a depletion FET with gate, source and drain terminals, the drain terminal of the depletion FET being connected to the gate terminal of the control transistor, the source terminal of the depletion FET being connected to the node of the voltage divider, and the gate terminal of the depletion FET being connected to the source terminal of the power MOSFET.

In accordance with another feature of the invention, the voltage divider includes another MOSFET and another resistor having one terminal connected to the other MOSFET and another terminal connected to the source terminal of the power MOSFET; and the other MOSFET and the other resistor are dimensioned for operating in the saturation range at a drain-to-source voltage that drops at the power MOSFET at a rated current.

In accordance with a further feature of the invention, the depletion FET has a substrate terminal connected to the source terminal of the power MOSFET.

In accordance with an added feature of the invention, the resistor connected between the gate terminals of the power MOSFET and the control transistor is a current source.

In accordance with a concomitant feature of the invention, the control transistor is an enhancement MOSFET.

Other features which are considered as characteristic for the invention are set forth in the appended claims.

Although the invention is illustrated and described herein as embodied in a circuit configuration for limiting the load current of a power MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic circuit diagram of a first embodiment of a configuration for regulating a load current through a power MOSFET, having a load on its source end;

FIG. 2 is a circuit diagram of a second embodiment of a configuration similar to FIG. 1, but with a load on its drain end.

Figure 3:
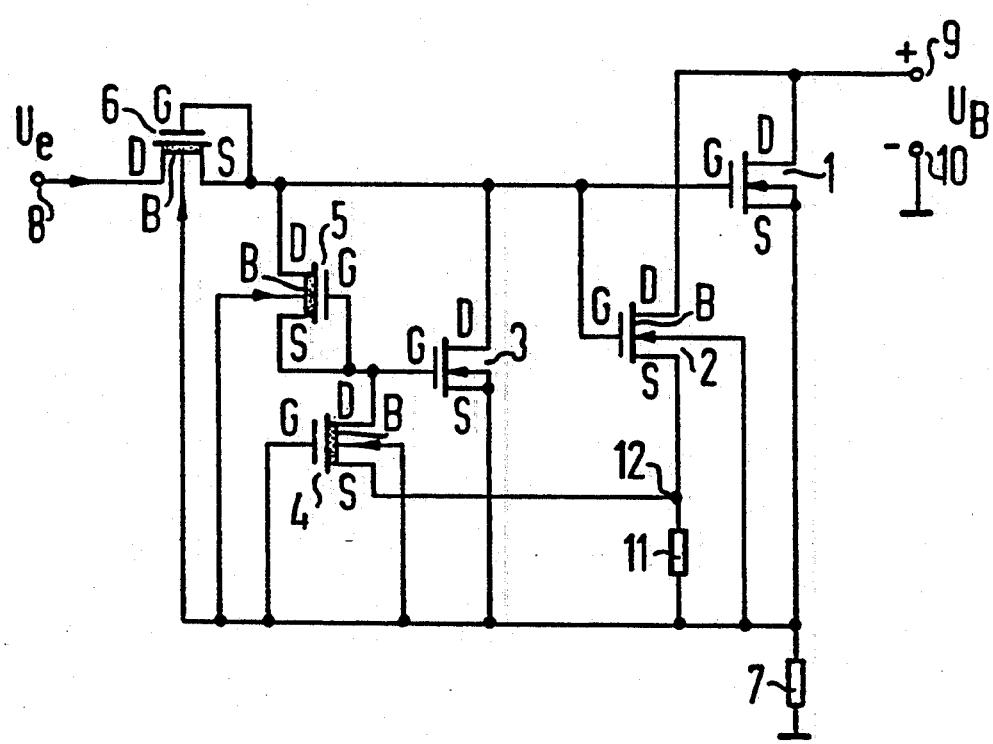
FIG. 3 is a circuit diagram of a third embodiment similar to the configuration of FIG. 1, that is easy to integrate.

Referring now to the figures of the drawing in detail and first, particularly, to FIG. 1 thereof, there is seen a circuit configuration which includes a power MOSFET 1 with a gate terminal G, a source terminal S and a drain terminal D. A load 7 is connected in series with the power MOSFET 1 on its source end. This series circuit is connected to an operating voltage $U_B$ through two terminals 9, 10. A voltage divider which includes an enhancement FET 2 and a resistor 11 is connected between the drain terminal D and the source terminal S of the MOSFET 1. The resistor 11 is connected to the source terminal S and the drain terminal D of the FET 2 is connected to the drain terminal D of the power MOSFET 1. The gate terminal G of the FET 2 is connected to the gate terminal G of the power MOSFET 1. The drain-to-source path of a control transistor 3 is connected between the gate terminal G and the source terminal S of the power MOSFET 1. The drain-to-source path of a depletion FET 4 is connected between the gate terminal G of the control transistor 3 and a node 12 of the voltage divider 2, 11, with the source terminal of this depletion FET 4 being connected to the node 12. The gate terminal G and a substrate terminal B of the depletion FET 4 are connected to the source terminal of the power MOSFET 1. The gate terminal G of the control transistor 3 is also connected to the gate terminal of the power MOSFET 1, through a high-impedance resistor 5. Both gate terminals are connected through a resistor 6 to an input terminal 8.

If a control voltage $U_e$ is applied to the input terminal 8, then the power MOSFET 1 is made conducting, and a load current flows. The network including the resistor 5, the depletion FET 4 and the voltage divider 2, 11 is constructed in such a way that the control transistor 3 remains blocked as long as the drain-to-source voltage of the power MOSFET remains below a predetermined value. If the load current rises, for instance from a short circuit in the load 7, then the drain-to-source voltage at the power MOSFET 1 increases. The voltage at the voltage divider 2, 11 increases accordingly, and the depletion FET 4 becomes less conductive. As a result, the gate-to-source capacitor of the control transistor 3 can be charged through the resistors 6 and 5, and this transistor becomes conducting. This lowers the control voltage of the power MOSFET 1, and the load current is reduced.

In order to provide a clear definition of the threshold at which the control transistor 3 is supposed to be made conducting, it is recommended that the voltage divider 2, 11 be dimensioned in such a wa that the FET 2 is already operating at saturation at the rated current of the power MOSFET 1. Then the increase in the drain-to-source voltage of the power MOSFET makes itself felt virtually exclusively at the node 12 and therefore at the source terminal of the depletion FET 4. As a result, blocking of the depletion FET can be attained at even a low voltage excursion.

An even steeper cutoff characteristic curve of the depletion FET 4 is attained if, as noted, the substrate terminal is at the same potential as the gate terminal of the depletion FET 4 and at the same potential as the source terminal of the power MOSFET 1. As a result, the normally conductive channel of the depletion FET 4 is modulated in its conductivity both from the surface and from the substrate side, and a very steep I/U characteristic curve of the depletion FET 4 is achieved. However, the depletion FET also functions if its substrate terminal B is connected to its source terminal, although then the I/U characteristic curve is not as steep.

The circuit configuration of FIG. 2 differs from that of FIG. 1 only in that in FIG. 2, the load 7 is located between the drain terminal D of the power MOSFET 1 and the supply voltage terminal 9. The mode of operation is the same.

As is seen in FIG. 3, an even more easily integratable configuration can be created if, in addition to the field effect transistors 1, 2, 3, 4, the resistors 5 and 6 are also constructed as field effect transistors. The gate terminal of each of the resistors 5 and 6 is connected to the source terminal thereof. They accordingly operate as current sources. The substrate terminals B of the resistors 5 and 6 are connected to the substrate terminals of the field effect transistors 1, 2, 3 and 4.

As a general rule in dimensioning the resistors 6, 5 and 11, the resistor 5 must have a higher impedance by approximately 2 to 3 orders of magnitude than the resistors 6 and 11. For example, the resistance of the resistor 6 may be between 1 and 10 kΩ, while that of the resistor 5 is 1 MΩ and that of the resistor 11 is 1 kΩ.

We claim:

1. In a circuit having a power MOSFET with gate, source and drain terminals and a drain-to-source voltage, a circuit configuration for limiting current flowing through the power MOSFET, comprising:
   a) a voltage divider being connected between the drain and source terminals of the power MOSFET and having a node at which a voltage following the drain-to-source voltage of the power MOSFET is provided;
   b) a control transistor with a gate terminal and with source and drain terminals defining a load path connected between the gate terminal and the source terminal of the power MOSFET, said control transistor being made conducting as a function of the voltage at the node of said voltage divider if the drain-to-source voltage of the power MOSFET exceeds a predetermined value;
   c) a resistor connected between the gate terminal of said control transistor and the gate terminal of the power MOSFET; and
   d) a depletion FET with gate, source and drain terminals, the drain terminal of said depletion FET being connected to the gate terminal of said control transistor, the source terminal of said depletion FET being connected to the node of said voltage divider, and the gate terminal of the depletion FET being connected to the source terminal of the power MOSFET.

2. The circuit configuration according to claim 1, wherein said voltage divider includes an other MOSFET and another resistor having one terminal connected to said other MOSFET and another terminal connected to the source terminal of the power MOSFET; and said other MOSFET and said other resistor are dimensioned for operating in the saturation range when the power MOSFET operates at a rated current.

3. The circuit configuration according to claim 1, wherein said depletion FET has a substrate terminal connected to the source terminal of the power MOSFET.

4. The circuit configuration according to claim 1, wherein said resistor connected between the gate terminals of the power MOSFET and said control transistor is a current source.

5. The circuit configuration according to claim 1, wherein said control transistor is an enhancement MOSFET.

* * * * *